United States Patent [19]
Andrews, Jr. et al.
[11] Patent Number: 4,715,820
[45] Date of Patent: Dec. 29, 1987

[54] CONNECTION SYSTEM FOR PRINTED CIRCUIT BOARDS

[75] Inventors: Howard W. Andrews, Jr., Hershey; Charles S. Pickles, Hummelstown; Attalee S. Taylor, Palmyra, all of Pa.

[73] Assignee: AMP Incorporated, Harrisburg, Pa.

[21] Appl. No.: 913,183

[22] Filed: Sep. 29, 1986

[51] Int. Cl.[4] .......................... H01R 9/09; H05K 1/10
[52] U.S. Cl. ........................................ 439/59; 439/79; 439/633
[58] Field of Search ......... 339/186 R, 186 M, 184 M, 339/184 R, 17 L, 17 LC, 17 R, 17 LM, 17 M, 206 R, 206 P, 176 MP, 75 MP, 75 M

[56] References Cited

U.S. PATENT DOCUMENTS

| | | | |
|---|---|---|---|
| 3,299,392 | 1/1967 | Evans | 339/17 L |
| 3,524,161 | 8/1970 | Frantz et al. | 339/176 MP |
| 3,634,816 | 1/1972 | Zeli . | |
| 3,692,966 | 9/1972 | Lancaster | 339/176 MP |
| 3,757,277 | 9/1973 | Yamanoue et al. | 339/176 M |
| 4,042,289 | 8/1977 | Heinonen et al. | 339/17 LC |
| 4,045,114 | 8/1977 | Dechelette . | |
| 4,047,782 | 9/1977 | Yeager | 339/17 L |
| 4,619,495 | 10/1986 | Socher . | |

*Primary Examiner*—Gil Weidenfeld
*Assistant Examiner*—Thomas M. Kline
*Attorney, Agent, or Firm*—Allan B. Osborne

[57] ABSTRACT

A connection system for electrically interconnecting circuits on a printed circuit mother board and printed circuit daughter board. More particularly, the connection system includes a first connector having a slot and for mounting on the mother board and a second connector having a blade for being received in the slot of the first connector and for being attached to an edge of the daughter board. Polarizing keyway and key bar are provided on respective first and second connectors to prevent incorrect insertion and to provide precise registration of contact elements in the respective connectors.

8 Claims, 13 Drawing Figures

Fig. 9
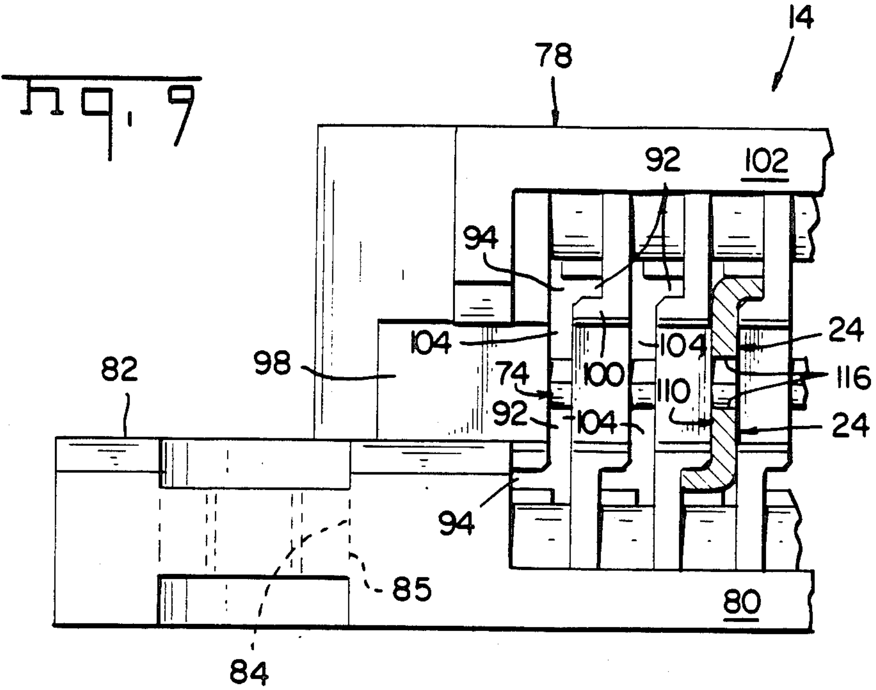
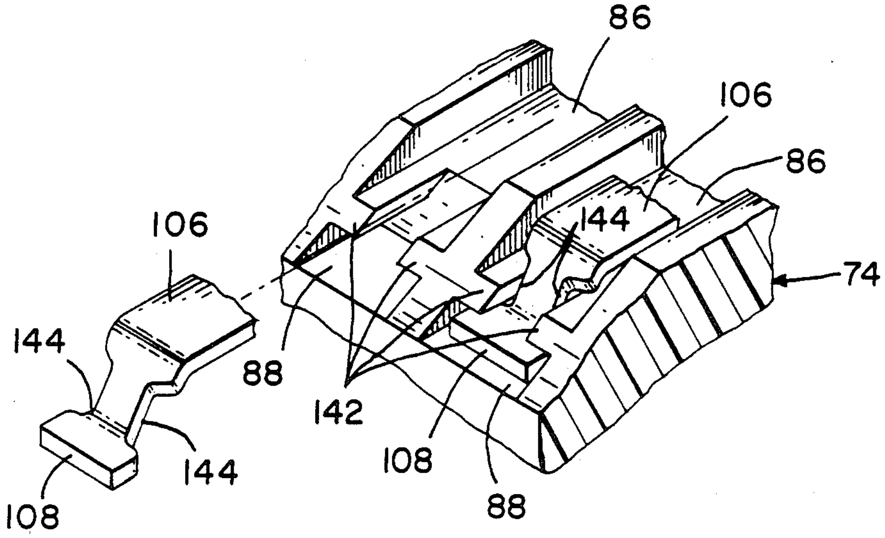
Fig. 13

CONNECTION SYSTEM FOR PRINTED CIRCUIT BOARDS

FIELD OF THE INVENTION

The present invention relates to electrical connectors for use with printed circuit boards. More particularly, the connection system includes a first connector, mounted on a printed circuit mother board, which receives a second connector, secured to a printed circuit daughter board, to electrically join circuits on the respective boards.

BACKGROUND OF THE INVENTION

The general practice in industry today is to mount an edge connector on a printed circuit mother board and insert a printed circuit daughter board into the edge connector to electrically join circuits on the two boards through contact elements in the connector.

Whereas the above practice is well accepted and widely used in the industry, it does require gold plated traces on the daughter board to engage the contact elements in the edge connector. Gold plating, as is well known, is expensive and requires additional manufacturing time in board fabrication. Further, if a trace becomes damaged in the manufacturing process, very often the entire board must be scrapped.

Another problem experienced on occasion is that the wrong edge of the daughter board will be inserted into the edge connector with electronic components thereon being damaged electrically.

It is, therefore, desirable to provide a circuit board connection system which will electrically connect a daughter board having tin-lead traces to a mother board. It is further desirable to provide the connection system with cooperating polarizing keys so that the daughter board is always correctly connected to the mother board.

SUMMARY OF THE INVENTION

According to the present invention, a connection system for electrically interconnecting circuits on two printed circuit boards is provided. The system includes a first connector for mounting on one circuit board and having contact elements in electrical engagement with circuits on the board and extending along both sides of a slot and a second connector, attached to the second circuit board and having contact elements in electrical engagement with circuits on that board and extending along both sides of an outwardly extending blade which is inserted into the slot of the first connector with the contact elements in both connectors electrically engaging each other to interconnect the circuits on the two circuit boards.

BRIEF DESCRIPTION OF THE DRAWINGS

FIG. 8 is a perspective, partly sectioned view of the first connector, the second connector and a fragmentary view of the circuit board showing the hole diagram thereon;

FIG. 9 is a fragmentary, plan view of the second connector looking into one end thereof;

FIG. 13 is a perspective view of a fragment of the second connector showing a modified embodiment thereof.

DESCRIPTION OF THE INVENTION

Figure 1:
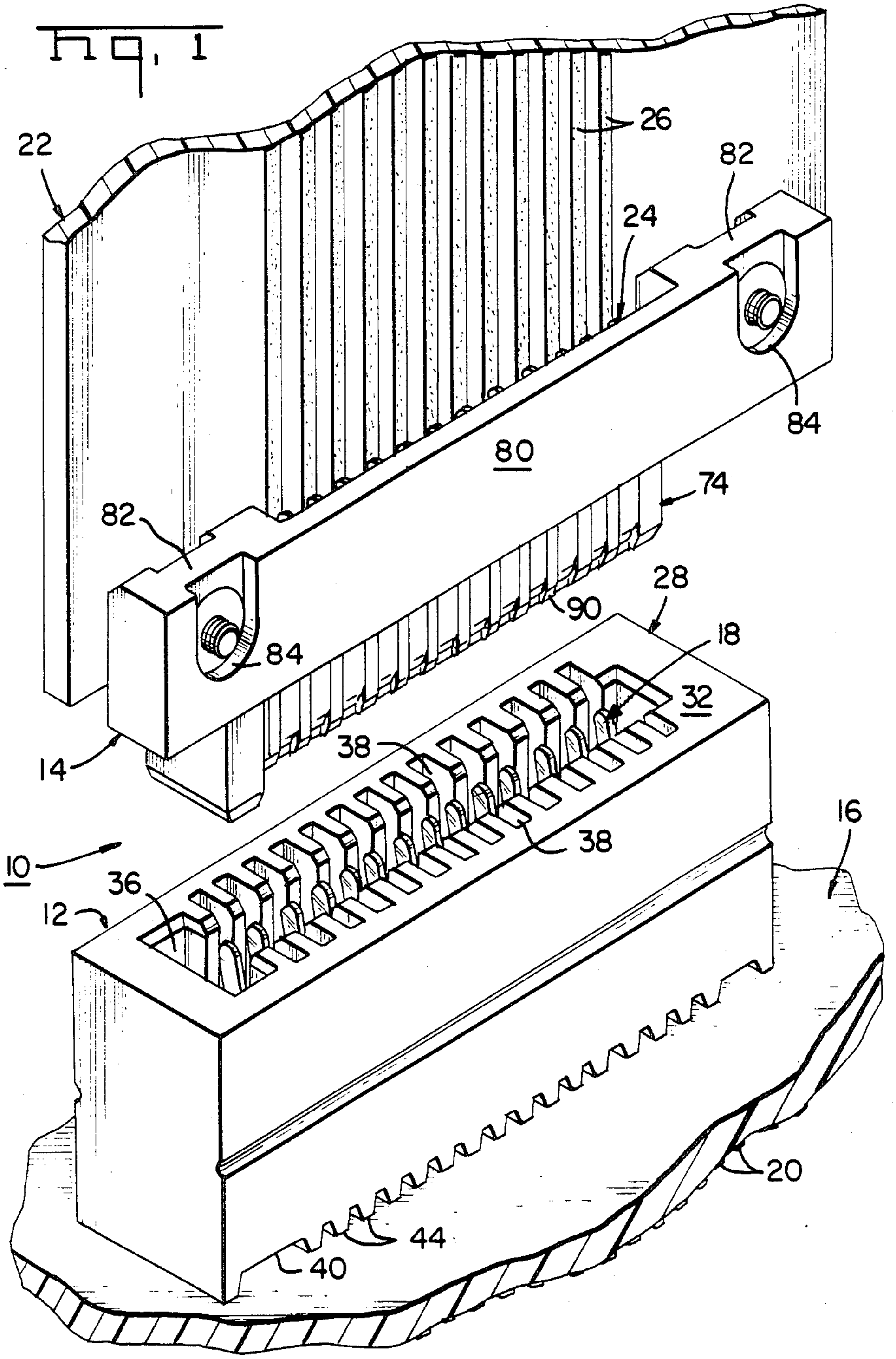
FIG. 1 is a perspective view of the circuit board connection system of the present invention which includes a first connector, mounted on a printed circuit mother board, and a mating, second connector mounted on a printed circuit daughter board.

Circuit board connection system 10, as shown in FIG. 1, includes first connector 12 and second connector 14. Connector 12 is mounted on printed circuit mother board 16, with contact elements 18 in connector 12 making electrical contact with conductive traces or circuits 20. Second connector 14 is attached to printed circuit daughter board 22 with contact elements 24 therein electrically engaging conductive traces or circuits 26 on board 22. Circuits 20 and 26 are electrically connected together upon inserting second connector 14 into first connector 12 as will be more fully described below.

Figure 2:
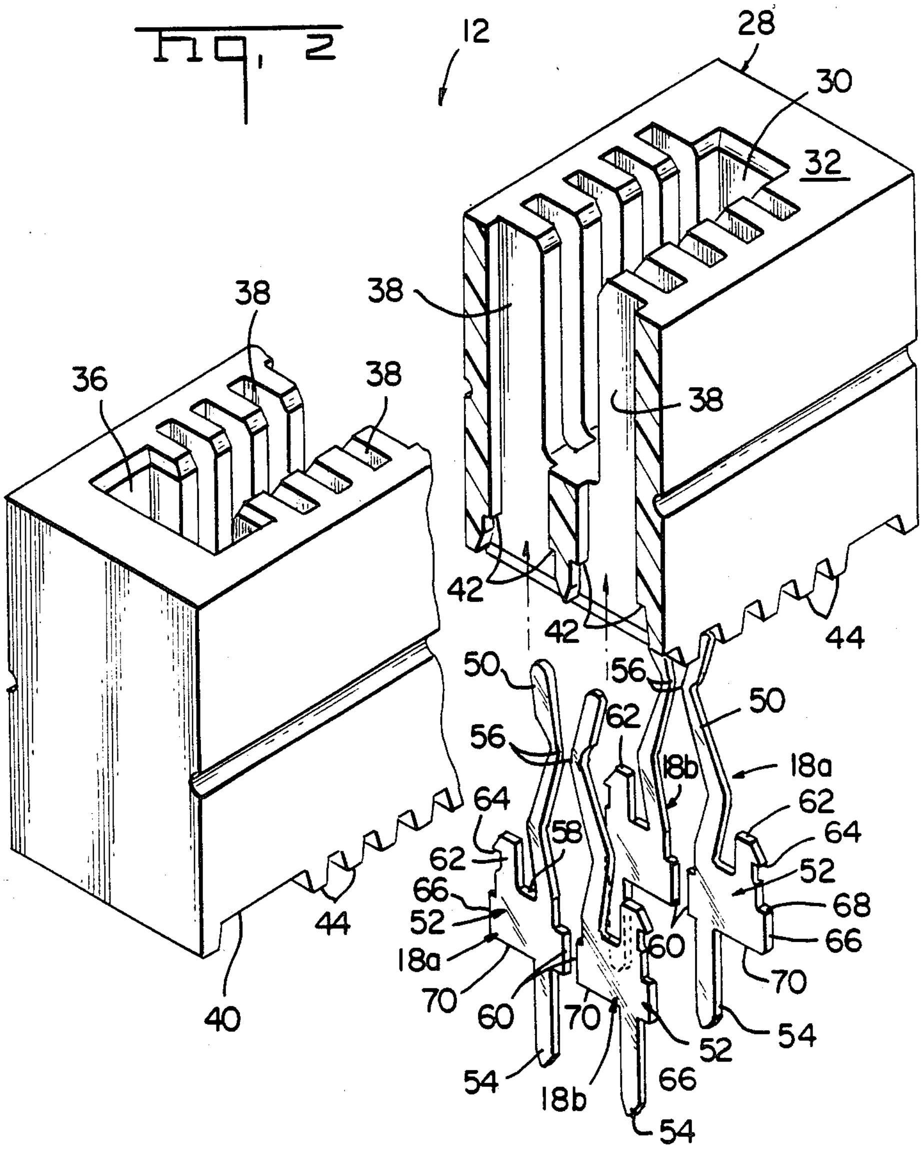
FIG. 2 is a perspective, partly sectioned view of the first connector with contact elements exploded therefrom.

With reference to FIG. 2, first connector 12 includes housing 28 and the aforementioned contact elements 18.

A longitudinal slot 30 extends into housing 28 from top surface 32 with a transverse aperture or keyway 36 provided at one end thereof. Transverse passages 38, extending through housing 28 and opening onto top surface 32 and bottom surface 40 are provided on both sides of slot 30. Downwardly facing shoulders 42 are located on each side of each passage 38 adjacent bottom surface 40. A plurality of spaced ribs 44 extend across bottom surface 40.

Preferably, housing 28 is molded from a dielectric material such as glass fiber reinforced polyester.

Contact elements 18 include elements **18*a* and 18*b* with each including cantilever or spring arm 50, retaining plate 52 and lead or pin 54. Arm 50 has a zig-zag shape with a convex contact surface 56** near the free end.

Arm 50 is connected to retaining plate 52 on top edge 58 and is adjacent to side 60. A short post 62 with an outwardly projecting sharp point 64 is connected to plate 52 on top edge 58 and is adjacent to side 66. Upwardly facing shoulders 68 are provided on both sides 60, 66.

Pins 54 on contact elements **18*a* are attached to plate 52 on bottom edge 70 and are adjacent to side 60. Pins 54 on contact elements 18*b* are attached to plate 52 on bottom edge 70 and is adjacent to side 66. The purpose for providing pins 54 at different locations on plates 52** will be noted below.

Contact elements **18*a*, 18*b*** are preferably stamped and formed from a suitable electrically conductive flat metal stock such as a copper alloy. As can be seen, elements 18*a*, 18*b* are stamped so that contact surface 56 is on an edge thereof and accordingly is more narrow than contact surfaces (not shown) on prior art contact elements.

Figure 3:
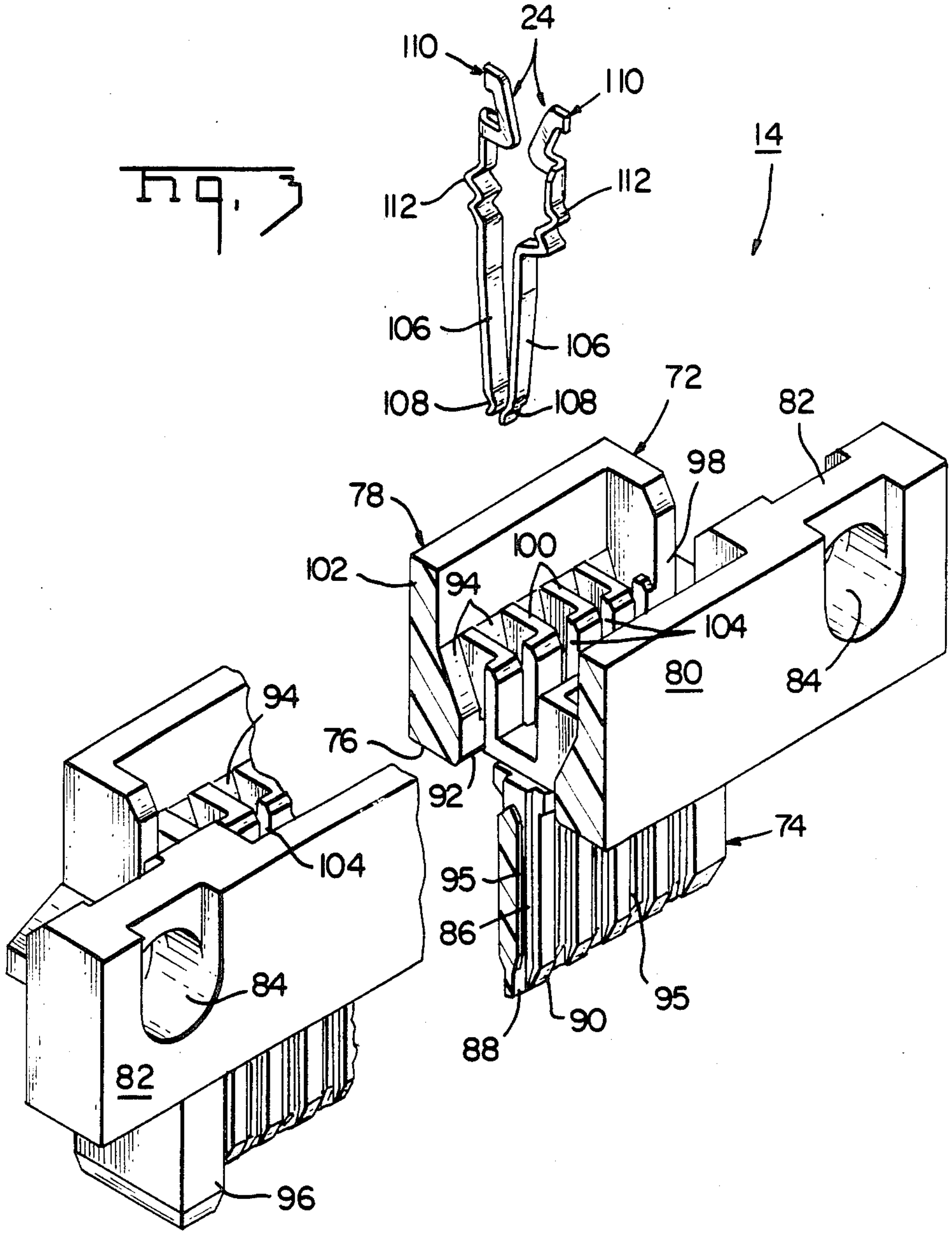
FIG. 3 is a perspective, partly sectioned view of the second connector with contact elements exploded therefrom.

As shown in FIG. 3, second connector 14 includes housing 72 and the aforementioned contact elements 24.

Housing 72 is a one-piece molding with one preferred material being a high temperature polymer. Blade 74 extends outwardly from front wall 76 of body 78 of housing 72. At each end of side wall 80 of body 78 is a mounting ear 82 with a hole 84 therethrough in which a threaded insert 85 (FIG. 9) may be placed.

With respect to blade 74, grooves 86, having recesses 88 at their distal ends, extend from chisel tip end 90 of blade 74 to respective passages 92 which pass through front wall 76 to respective cavities 94 in body 78. A second, deeper and narrower groove 95, located in the floor of each groove 86, also extends along blade 74 and into passage 92.

Key bar 96 extends forwardly from front wall 76 at one end of blade 74 and is normal relative thereto.

Cavities 94 in body 78 of housing 72 are on both sides of a longitudinal slot 98 and are defined by L-shaped walls 100 extending inwardly from respective side wall 80 and opposing side wall 102. Notches 104 provide access to slot 98 from respective cavities 94. As particularly shown in FIG. 9, cavities 94 on one side of slot 98 are longitudinally displaced by one half the width of a cavity relative to cavities 94 on the opposite side of slot 98. Notches 104, however, are directly opposite each other.

Contact elements 24 include at one end an elongated finger 106 having a displaced free end 108 and a contact arm 110 at the opposite end. A spring section 112 is between and connects to finger 106, arm 110.

With reference to FIGS. 4 through 7, it can be seen that contact arm 110 has been bent about the longitudinal axis 90 degrees relative to finger 106 and section 112. Arm 110 is nose-shaped, which provides a slanted lead-in ramp 114 leading to a convex contact edge surface 116. Being on an edge, surface 116 is substantially narrower than contact surfaces (not shown) on contact elements in prior art connectors. Connecting strap 118 connects arm 110 to section 112.

Figure 4:
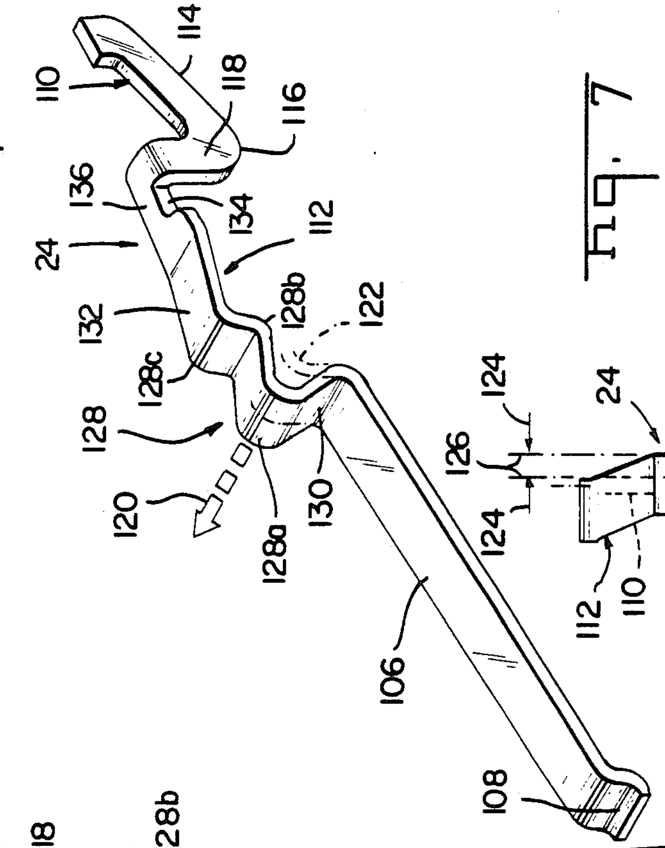
FIG. 4 is a perspective view of the contact element of the second connector.
Figure 7:
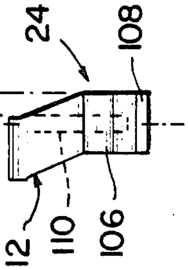
FIGS. 5 through 7 are orthographic views of the contact element of FIG. 4.
Figure 5:
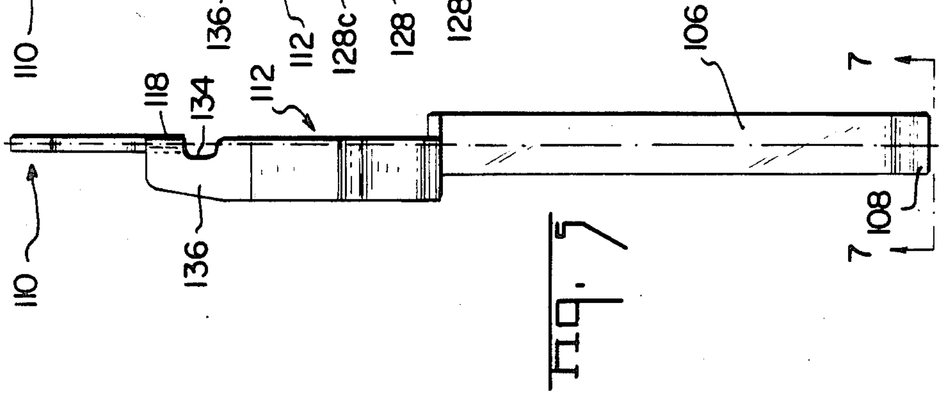
Figure 6:
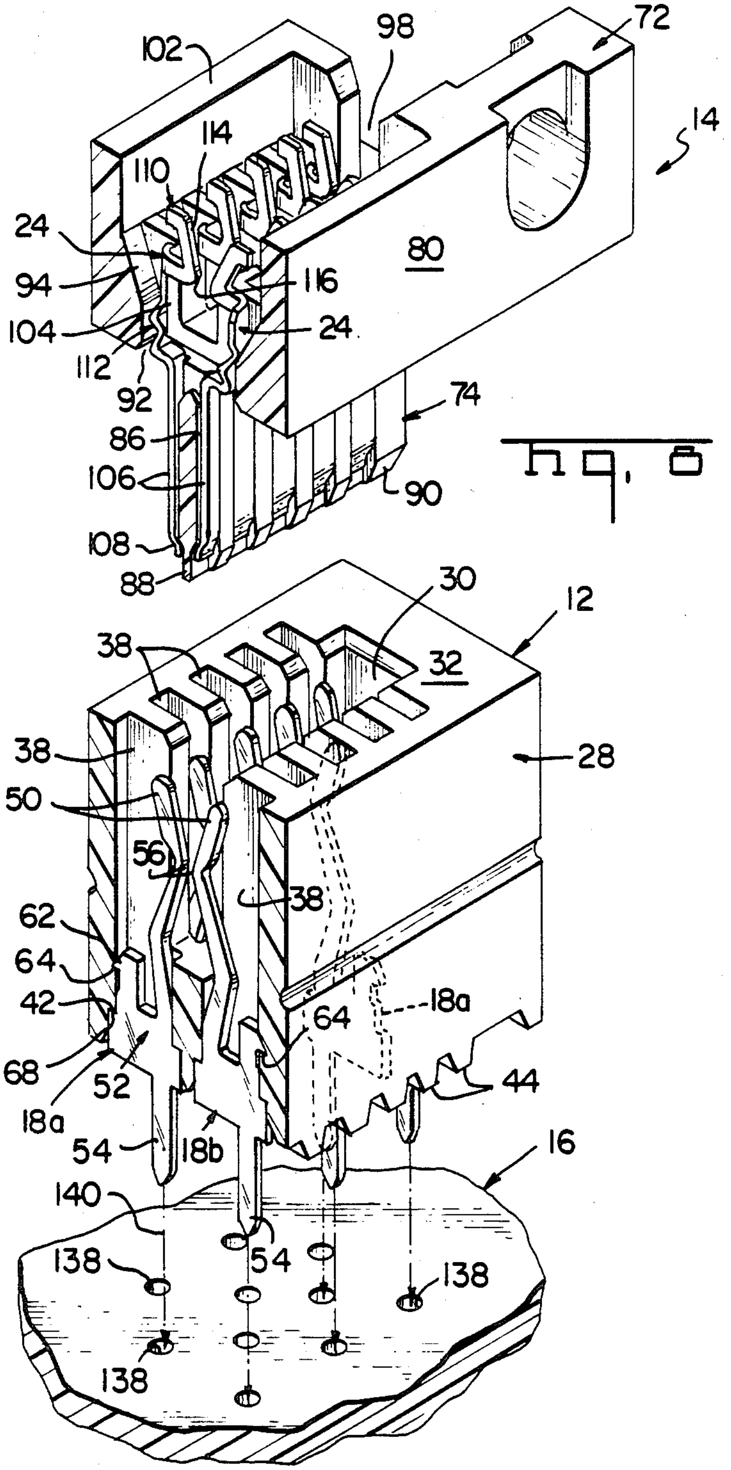

Spring section 112 is stamped to be offset laterally with respect to the center line of element 24 as shown in FIGS. 4, 5, and 7. To illustrate the offset, the shift is indicated by arrow 120 in FIG. 4. Also, phantom lines 122 in FIG. 4 indicate the positioning of section 112 in the absence of the lateral offset. Note in FIGS. 5 and 7 that both finger 106 and contact arm 110 are symmetrically centered with respect to the center line of element 24. Also , the relative amount of shift is shown in FIG. 7 by arrows 124 and broken lines 126.

Spring section 112 includes a serpentine or wave portion 128 with curves 128,*b* and *c* located between strap 130, which is bent perpendicular relative to the plane of finger 106, and slanting portion 132. Curves 128*a*,*b* and *c* provide a long spring arm over a short linear distance. Notch 134 is provided in one edge of end portion 136 of section 112.

Figure 6:
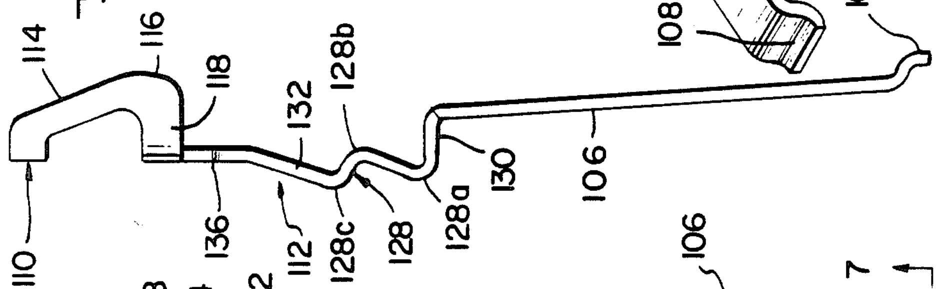

As clearly shown in FIG. 6, using end portion 136 as a reference plane, finger 106 is bent out of that plane for preloading purposes as will be noted below.

Figure 11:
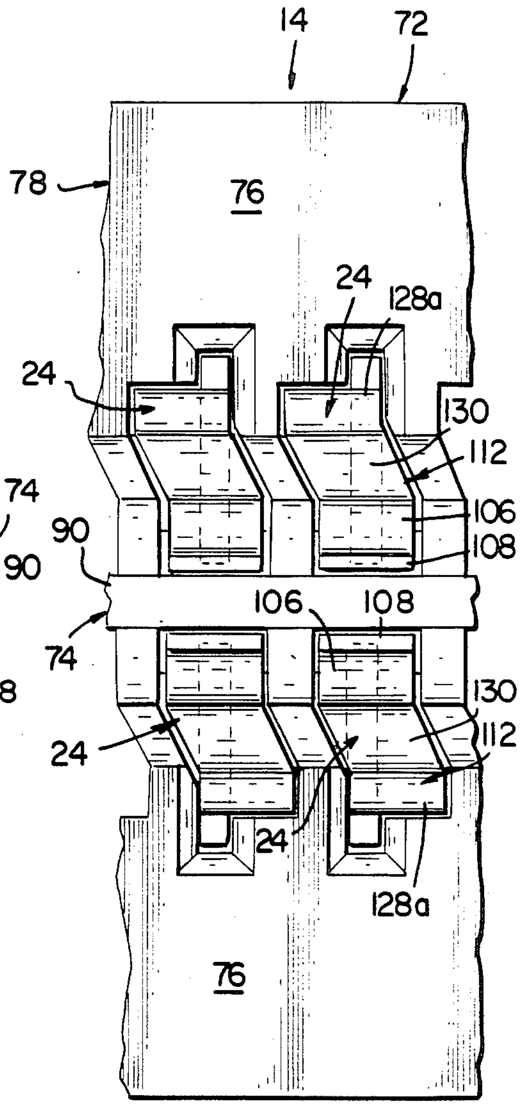
FIG. 11 is the same view as FIG. 10 but with contact elements in place.
Figure 12:
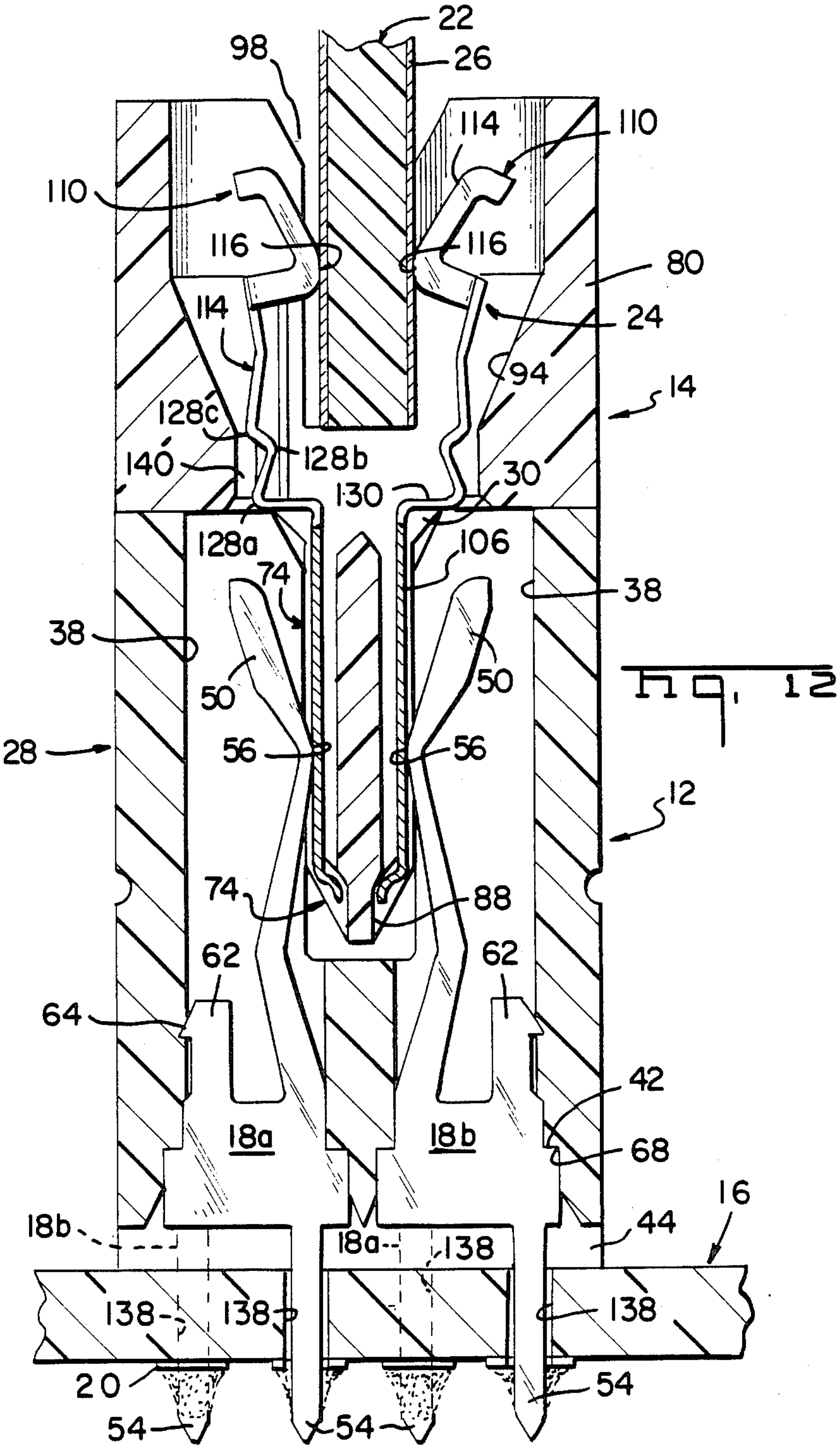
FIG. 12 is a cross-sectioned view showing the joined connection system electrically connecting circuits on a mother board and daughter board.

FIGS. 8 and 12 show the positioning of contact elements 18*a*,*b* in housing 28 of connector 12 and FIGS. 8, 9, 11 and 12 show the positioning of contact elements 24 in housing 72 of connector 14.

With regard to the former, contact elements 18*a*, 18*b* are loaded into passages 38 so that depending pins 54 are in line with holes 138 in circuit board 16 which are on a staggered pattern. To match the illustrated staggered pattern, elements 18*a*, 18*b* are positioned in opposing passages 38 so that pins 54 are closer to one or the other side wall of housing 28. To shift the positioning, elements 18*a*, 18*b* are rotated 180 degrees about their axis and placed in opposite passages 38 relative to elements 18*a*, 18*b* in the adjacent set of passages 38. This shift can be seen by comparing element 18*a* shown in the cut-away passage 38 with element 18*a* shown in phantom.

Obviously, passages 38 could be all loaded as shown in the cut-away passages 38 or in other combinations as required by the pattern of holes 138 in board 16.

As shown in FIGS. 8 and 12, contact elements 18*a*, 18*b* are positioned in passages 38 with contact surfaces 56 on arms 50 facing into slot 30 of housing 28. Positioning is provided by shoulders 68 on plate 52 abutting shoulders 42 and retention is provided by points 64 on posts 62 digging into the passage walls and an interference fit between the walls and plate 52.

With regard to contact elements 24 being positioned in housing 72 of second connector 14, preloaded fingers 106 lie in grooves 86 with free ends 108 in recesses 88. Spring section 112 occupies passage 92 and cavity 94. Contact arm 110 extends through notch 104 with contact edge surface 116 in slot 98 and with ramp 114 extending upwardly in slot 98. Contact elements 24 are received in opposing cavities 94 such that contact edge surfaces 116 directly face each other as shown in FIGS. 8, 9 and 12. As shown in FIG. 12, retention is obtained by preloaded fingers 106 being biased in grooves 86 and with curves 128*c* catching on ledges 140 located on the inside surfaces of sidewalls 80, 102.

Figure 10:
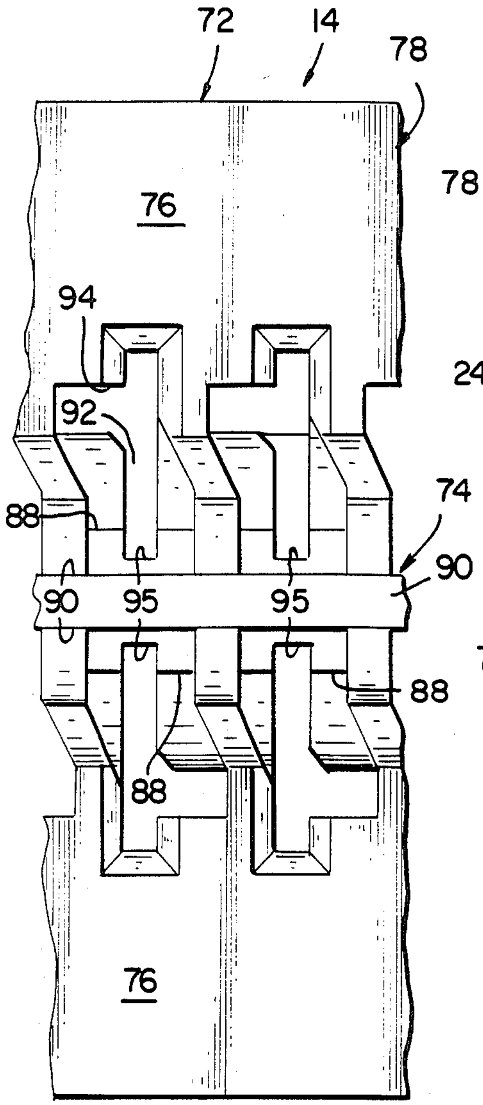
FIG. 10 is a fragmentary, plan view of the second connector looking into another end thereof without contact elements in place.

FIGS. 9, 10 and 11 have been included to provide a clearer understanding of cavities 94 in second connector 14 and the placing of elements 24 therein. The view in FIG. 9 is one looking into slot 98 as seen by board 22 being inserted thereinto. Four cavities 94 to the left are empty and contact elements 24 are in the two cavities 94 on the right. with cavities 94 on one side of slot 98 being offset longitudinally relative to those cavities 94 in the opposite side, contact elements 24 are conformably received on either side and contact edge surfaces 116 on elements 24 on one side of slot 98 directly face surfaces 116 on elements 24 on the opposite side.

FIGS. 10 and 11 are views looking at blade 74 and front wall 76 of body 78 of housing 72 and into cavities 94 through passages 92. Contact elements 24 are loaded into housing 72 in FIG. 11.

As shown in FIG. 10, groove 95, located within groove 88, is provided to permit passage of spring arm 110 through passage 92 and into cavity 94; i.e., elements 24 are loaded into cavities 94 from the blade side of housing 72.

FIG. 11 illustrates the positioning of offset spring section 112 in passage 92.

As shown in FIG. 12, first connector 12 is mounted on mother board 16 by pins 54 being inserted and soldered in holes 138. Ribs 44 provide stand-off from board 16 to facilitate post-solder washing. Other types of pins (not shown) could be used; e.g. pins having compliant sections such as disclosed in U.S. Pat. No. 4,186,982 or solder feet as disclosed in U.S. Pat. No. 4,550,959.

Daughter board 22 is inserted into slot 98 in second connector 14 wherein contact edge surfaces 116 on contacts 24 electrically engage tin-lead circuits 26 thereon. As board 22 is inserted, it slides down ramps 114, spreading opposing contact arms 110 and spring section 112 apart. The forces generated thereby provide a high normal force between contact 24 and tin-lead circuits 26 for good electrical engagement. Also, contact surfaces 116 could be soldered to circuits 26. After insertion, board 22 and connector 14 are attached together as shown in FIG. 1 or by other equally suitable means.

Circuits 20 on mother board 16 and circuits 26 on daughter board 22 are electrically joined by inserting blade 74 on second connector 14 into slot 30 in first connector 12 where contact surfaces 56 on spring arms 50 of contact elements 18 engage fingers 106 on contact elements 24. The spring characteristics of arms 50 provide a high normal force, which enhances electrical contact between contact elements 18, 24. It is worth noting at this point that the wear against fingers 106 on contacts 24 from the high normal forces and the resulting earlier replacement of connector 14 is more acceptable to the user than wear and earlier replacement of the more expensive daughter board 22 having gold plated traces.

Connectors 12, 14 can be mated only in one orientation in that key bar 96 must be able to enter keyway 36. This prevents mis-insertion and possible damage that can occur thereby. Further, bar 96 and keyway 36 cooperate to insure precise registration between respective cantilever arms 50 and fingers 106. In this regard, keyway 36 and bar 96, or equivalent polarizing devices, could be positioned anywhere along slot 30 and blade 74 respectively.

During insertion with free ends 108 of fingers 106 being in recesses 88 at the distal ends of grooves 86, snubbing thereof is prevented. Free ends 108 of fingers 106 and grooves 86 could be modified as shown in FIG. 13 by placing tabs 142 extending into recesses 88 from the groove walls and providing notches 144 on each side of free ends 108 so that they can be tucked in under tabs 142 to hold fingers 106 in place in grooves 86.

As noted above, contact surfaces 56 on contact elements 18 and contact surfaces 116 on contact elements 24 are on an edge and accordingly are very narrow. This feature substantially prevents shorting on adjacent traces 26 on daughter board 22 by elements 24 and shorting on adjacent fingers 106 on elements 24 by elements 18.

As can be discerned, a connection system has been disclosed which includes a first connector which is mounted on a printed circuit mother board and with contact elements in the connector electrically engaging the circuits on the mother board. The system further includes a second connector which is secured to a printed circuit daughter board and with contact elements in the second connector electrically engaging the circuits on the daughter board and also extending outwardly from the connector on a blade thereon. The circuits on the two boards are electrically connected by inserting the blade on the second connector into a slot in the first connector whereupon the contact elements of each connector electrically engage each other. The contact elements in each connector are stamped and formed to provide contact engaging surfaces on the edges thereof. Further, each connector includes cooperating polarizing members to prevent incorrect mating of the two and to align the blade in the slot to prevent shorting between adjacent elements.

We claim:

1. A connection system for electrically interconnecting circuits on a printed circuit mother board and on a printed circuit daughter board, said system comprising:

first connector having an elongated slot opening outwardly and a plurality of electrical contact means with spring means disposed on both sides of said slot and pin means extending outwardly therefrom for electrical engagement with circuits on the mother board; and a second connector comprising housing means and electrical contact means, said housing means including an elongated, outwardly extending blade means on one side, slot means in an opposite side for receiving the daughter board, cavities on each side of said slot with said cavities on one side being longitudinally offset relative to the facing cavities and further said cavities communicating with said slot through notches with the notches on one side of said slot facing the notches on the other side, said contact means having finger means disposed on said blade means for electrically engaging said spring means upon inserting said blade means in said slot in said first connector, said contact means further having contact are means disposed in said cavities and projecting into said slot through said notches for electrically engaging circuits on the daughter board which may be inserted in said slot means and further having spring section means intermediate said finger means and contact arm means, said section means having a concave-convex shape to provide an elongated spring section over a short linear distance, said contact arm means being formed normal to the plane of said finger means and spring section means.

2. The connection system of claim 1 wherein said spring section means of said contact means of said second connector is offset laterally relative to the longitudinal axis of said contact means so that said contact arm means extending through said notches on one side of said slot directly face contact arm means extending through said notches on the other side of said slot.

3. The connection system of claim 2 wherein said contact arm means of said contact means of said second connector is nose-shaped with a lead-in ramp and a convex contact surface for engaging circuits on the daughter board.

4. The connection system of claim 1 wherein said contact means of said first connector includes plate means intermediate said spring means and said pin means.

5. The connection system of claim 4 wherein said spring means are attached to the top edge and adjacent one side of said plate means.

6. The connection system of claim 5 wherein said pin means on some of said contact means of said first connector are attached to the bottom edge adjacent said one side of said plate means and on other of said contact means of said first connector, said pin means are attached to the bottom edge adjacent an opposite side of said plate means.

7. The connection system of claim 6 wherein said spring means on said contact means of said first connector includes a cantilever beam, having a plurality of oppositely facing convex-shaped surfaces, extending from said plate means with one of said convex-shaped surfaces adapted to electrically engage a respective finger means of said contact means of said second connector.

8. The connection system of claim 7 wherein said convex-shaped surfaces are edge surfaces of said cantilever beam.

* * * * *